(12) United States Patent
Kimura

(10) Patent No.: US 9,935,030 B2
(45) Date of Patent: *Apr. 3, 2018

(54) RESIN-ENCAPSULATED SEMICONDUCTOR DEVICE

(71) Applicant: SII Semiconductor Corporation, Chiba (JP)

(72) Inventor: Noriyuki Kimura, Chiba (JP)

(73) Assignee: SII Semiconductor Corporation (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/605,027

(22) Filed: May 25, 2017

(65) Prior Publication Data

US 2017/0263521 A1    Sep. 14, 2017

Related U.S. Application Data

(60) Continuation of application No. 15/289,298, filed on Oct. 10, 2016, now Pat. No. 9,728,478, which is a
(Continued)

(30) Foreign Application Priority Data

Mar. 5, 2015    (JP) .................................. 2015-043911
Jan. 18, 2016    (JP) .................................. 2016-007339

(51) Int. Cl.
*H01L 23/31*    (2006.01)
*H01L 23/538*    (2006.01)
(Continued)

(52) U.S. Cl.
CPC ...... *H01L 23/3135* (2013.01); *H01L 21/6835* (2013.01); *H01L 23/293* (2013.01);
(Continued)

(58) Field of Classification Search
CPC ............. H01L 23/3135; H01L 21/6835; H01L 23/49503; H01L 23/528; H01L 25/0655;
(Continued)

(56) References Cited

U.S. PATENT DOCUMENTS 9,508,684 B2 * 11/2016 Kimura ............... H01L 21/6835
2007/0187826 A1    8/2007 Shim et al. .................... 257/738

OTHER PUBLICATIONS

Abstract, Publication No. JP 07-193162, Publication Date Jul. 28, 1995.

* cited by examiner

*Primary Examiner* — Roy Potter
(74) *Attorney, Agent, or Firm* — Bruce L. Adams; Klintworth & Rozenblat IP LLP

(57) ABSTRACT

A first resin encapsulated body and a second resin encapsulated body are stacked to form a resin-encapsulated semiconductor device. The first resin encapsulated body includes: a first semiconductor element; an external terminal; inner wiring; and a first resin for covering those components, at least a rear surface of the external terminal, a rear surface of the semiconductor element, and a surface of the inner wiring are exposed from the first resin. The second resin encapsulated body includes: a second semiconductor element having an electrode pad formed on a surface thereof; a second resin for covering the second semiconductor element; and a metal body connected to the electrode pad, and is partly exposed from the second resin. The inner wiring and the metal body are electrically connected to each other.

12 Claims, 16 Drawing Sheets

Related U.S. Application Data division of application No. 15/053,267, filed on Feb. 25, 2016, now Pat. No. 9,508,684.

(51) Int. Cl.

| | |
|---|---|
| *H01L 23/00* | (2006.01) |
| *H01L 25/065* | (2006.01) |
| *H01L 21/683* | (2006.01) |
| *H01L 23/495* | (2006.01) |
| *H01L 23/528* | (2006.01) |
| *H01L 23/29* | (2006.01) |
| *H01L 23/552* | (2006.01) |
| *H01L 21/56* | (2006.01) |

(52) U.S. Cl.
CPC .. *H01L 23/49503* (2013.01); *H01L 23/49541* (2013.01); *H01L 23/49575* (2013.01); *H01L 23/528* (2013.01); *H01L 23/5384* (2013.01); *H01L 23/5386* (2013.01); *H01L 23/5389* (2013.01); *H01L 23/552* (2013.01); *H01L 24/16* (2013.01); *H01L 24/32* (2013.01); *H01L 24/48* (2013.01); *H01L 24/81* (2013.01); *H01L 24/83* (2013.01); *H01L 24/85* (2013.01); *H01L 24/96* (2013.01); *H01L 25/0655* (2013.01); *H01L 25/0657* (2013.01); *H01L 21/561* (2013.01); *H01L 21/568* (2013.01); *H01L 24/29* (2013.01); *H01L 24/45* (2013.01); *H01L 24/49* (2013.01); *H01L 2221/68327* (2013.01); *H01L 2221/68359* (2013.01); *H01L 2224/16227* (2013.01); *H01L 2224/16245* (2013.01); *H01L 2224/2919* (2013.01); *H01L 2224/29124* (2013.01); *H01L 2224/29139* (2013.01); *H01L 2224/29144* (2013.01); *H01L 2224/29147* (2013.01); *H01L 2224/29155* (2013.01); *H01L 2224/29164* (2013.01); *H01L 2224/32225* (2013.01); *H01L 2224/32245* (2013.01); *H01L 2224/45147* (2013.01); *H01L 2224/48137* (2013.01); *H01L 2224/48145* (2013.01); *H01L 2224/48227* (2013.01); *H01L 2224/48247* (2013.01); *H01L 2224/49113* (2013.01); *H01L 2224/73265* (2013.01); *H01L 2224/81* (2013.01); *H01L 2224/81005* (2013.01); *H01L 2224/81444* (2013.01); *H01L 2224/83* (2013.01); *H01L 2224/83001* (2013.01); *H01L 2224/83005* (2013.01); *H01L 2224/85* (2013.01); *H01L 2224/85001* (2013.01); *H01L 2224/85005* (2013.01); *H01L 2224/85444* (2013.01); *H01L 2224/95001* (2013.01); *H01L 2224/96* (2013.01); *H01L 2924/181* (2013.01); *H01L 2924/18161* (2013.01)

(58) Field of Classification Search
CPC .............. H01L 24/16; H01L 23/49541; H01L 23/49575; H01L 24/48; H01L 23/293; H01L 24/32; H01L 2924/181; H01L 2224/48137; H01L 2224/48145; H01L 2224/73265; H01L 2221/68327; H01L 2224/16245; H01L 2224/48247; H01L 2224/32245; H01L 2224/2919; H01L 2224/83005; H01L 21/561; H01L 24/17; H01L 23/49827; H01L 23/49838; H01L 21/486; H01L 23/49811; H01L 23/50; H01L 2224/16235; H01L 2224/16237; H01L 2224/16238; H01L 2224/1705; H01L 2924/13091; H01L 2924/15311
See application file for complete search history.

RESIN-ENCAPSULATED SEMICONDUCTOR DEVICE

BACKGROUND OF THE INVENTION

1. Field of the Invention

The present invention relates to a structure of a multichip resin-encapsulated semiconductor device and a method of manufacturing the same.

2. Description of the Related Art

Along with the needs of reduction in size and weight and improvement in function of electronic equipment, high density mounting of semiconductor parts into the electronic equipment is demanded, and in recent years, there have been required smaller and thinner semiconductor devices suitable for high integration.

In the context of such a trend, various types of semiconductor devices are proposed in response to various applications, such as a gull-wing type, a leadless type, a BGA type, and a wafer level package. Further, under recent environment in which reduction in product price is desired, those semiconductor devices are required to be provided in a cheaper price, as well as the small size and the highly integrated function. For example, in order to obtain the more highly integrated function, in a related-art semiconductor device, as illustrated in FIG. 7A, the following configuration is provided. That is, the semiconductor device includes: a semiconductor element 1; an adhesive for mounting the semiconductor element 1 on a die pad 23 which is provided on a substrate 10; metal wires 9 for connecting a plurality of wiring lines 20 provided on the substrate 10 to each other; and an encapsulation resin 11 for encapsulating the semiconductor element 1, the adhesive, the metal wires 9, and the plurality of wiring lines 20. On another surface of the substrate 10, solder balls 22 are formed as external terminals on respective external connection portions 21, that is, the semiconductor device has a structure called a ball grid array (BGA).

For the substrate 10, a heat-resistant substrate typified by a bismaleimide resin (BT resin) is used. The die pad 23 mounting the semiconductor element 1 and the plurality of wiring lines 20 are formed on one surface of the substrate, and the external connection portion 21 is formed on the another surface of the substrate. Via through holes 24 formed in the substrate 10, each of which is covered with a conduction layer, the respective surfaces are connected to each other. The solder balls 22, which electrically and physically connect a semiconductor encapsulation member and a mounting substrate to each other, are mounted on the external connection portion 21 in a lattice or zigzag arrangement (see, for example, Japanese Patent Application Laid-open No. 07-193162).

However, in the related-art BGA resin-encapsulated semiconductor device, unlike a semiconductor package using a metal lead frame, there is used a double-sided substrate or a multilayer wiring substrate, which uses a heat-resistant resin as a base, and hence steps of forming the substrate become complicated. For example, when the substrate is manufactured, it is necessary to manufacture a mask for circuit formation, for forming the wiring on the mounting surface side on which the semiconductor device is mounted, and for forming the external connection terminal on the another side. In addition, during the formation of the substrate, it is necessary to carry out resist coating, exposure and development, resist patterning, forming of the through hole and plating for electrically connecting the wiring and the external connection terminal to each other, resist separation processing, and adhesion of the substrates. As a result, there has been a problem in that the unit price per one substrate becomes more expensive than that in a case where the metal lead frame is used, and the total package cost becomes high.

Further, as illustrated in FIGS. 7B and 7C, when multichip packaging or module packaging is performed in which a plurality of semiconductor elements and electronic components are mounted on one semiconductor device, there are adopted modes in which a plurality of semiconductor elements are mounted side by side or are vertically stacked on a substrate. Thus, as the number of semiconductor elements or electronic components to be mounted increases, the size of the semiconductor device increases, which makes it difficult to provide smaller and thinner highly integrated electronic equipment using the semiconductor device.

SUMMARY OF THE INVENTION

The present invention has been made in order to solve the problem described above, and an object of the present invention is to provide a semiconductor device that is cheaper and smaller in size than the related-art multichip semiconductor device even when the number of semiconductor elements or electronic components to be mounted thereon increases.

In order to solve the problem described above, the following measures are taken.

First, according to one embodiment of the present invention, there is provided a resin-encapsulated semiconductor device, including:

a first resin encapsulated body; and a second resin encapsulated body, in which the first resin encapsulated body includes:

a first semiconductor element;

an external terminal spaced around the first semiconductor element;

inner wiring for connecting the first semiconductor element and a surface of the external terminal to each other; and a first resin for covering the first semiconductor element, the external terminal, and the inner wiring, in which a rear surface of the external terminal, a rear surface of the first semiconductor element, and a surface of the inner wiring are exposed from the first resin, in which the second resin encapsulated body includes:

a second semiconductor element;

a second resin for covering the second semiconductor element; and a metal body that is connected to the second semiconductor element, and is partly exposed from the second resin, and in which a surface of the first resin encapsulated body on which the inner wiring is exposed and a surface of the second resin encapsulated body on which the metal body is exposed are formed so as to be in intimate contact with each other, and the inner wiring and the metal body are electrically connected to each other.

Further, according to one embodiment of the present invention, there is provided a method of manufacturing a resin-encapsulated semiconductor device including a first resin encapsulated body and a second resin encapsulated body, the method including:

forming a plurality of inner wiring lines on one main surface of a substrate;

forming an external terminal on a part of a surface of at least one inner wiring line of the plurality of inner wiring lines on a side opposite to the substrate;

electrically connecting a first semiconductor element and the plurality of inner wiring lines to each other;

encapsulating, in a first resin, the one main surface side of the substrate on which the plurality of inner wiring lines, the external terminal, and the first semiconductor element are arranged;

grinding a surface of the first resin opposite to a surface on which the first resin is in contact with the substrate, to thereby expose a rear surface of the external terminal and a surface of the first semiconductor element opposite to a face side thereof;

opening another main surface of the substrate except for edge portions thereof, to thereby expose the plurality of inner wiring lines and the first resin;

electrically connecting a second semiconductor element and the plurality of inner wiring lines to each other via a metal body;

encapsulating, in a second resin, the second semiconductor element, the metal body, and the plurality of inner wiring lines to integrally form the first resin and the second resin so as to be in intimate contact with each other, to thereby form a resin encapsulated body; and separating the resin encapsulated body into individual resin-encapsulated semiconductor devices.

With the measures described above, the semiconductor device may be made cheaper and smaller in size than the related-art multichip semiconductor device having a plurality of semiconductor elements mounted thereon even when the number of semiconductor elements or electronic components to be mounted thereon increases, making contribution to provision of cheaper electronic equipment with the semiconductor device, which is smaller in size and thickness, and has higher integration.

BRIEF DESCRIPTION OF THE DRAWINGS

FIG. 1A is a perspective view of the semiconductor device seen from an external terminal side, and FIG. 1B is a sectional view taken along the line A-A of part (1).

FIG. 7A to FIG. 7C are sectional views for illustrating related-art resin-encapsulated semiconductor devices, in which FIG. 7A is a sectional view for illustrating a mode where a single chip is mounted, and FIG. 7B and FIG. C are sectional views for illustrating modes where multiple chips are mounted.

FIG. 8A and FIG. 8B are an illustration of a structure of a resin-encapsulated semiconductor device according to a fifth embodiment of the present invention, in which FIG. 8A is a perspective view of the semiconductor device seen from an external terminal side, and FIG. 8B is a sectional view taken along the line A-A of FIG. 8A.

DETAILED DESCRIPTION OF THE INVENTION

A resin-encapsulated semiconductor device according to a first embodiment of the present invention is described below.

Figure 1A:
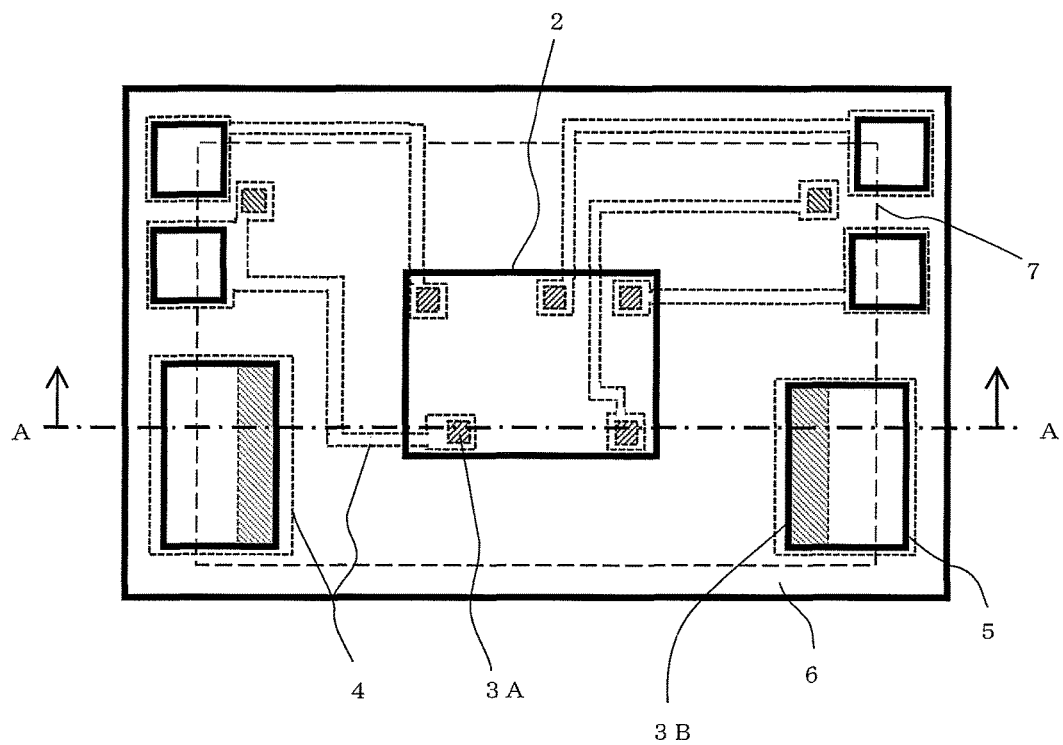
FIG. 1A and FIG. 1B are an illustration of a structure of a resin-encapsulated semiconductor device according to a first embodiment of the present invention, in which part
Figure 1B:
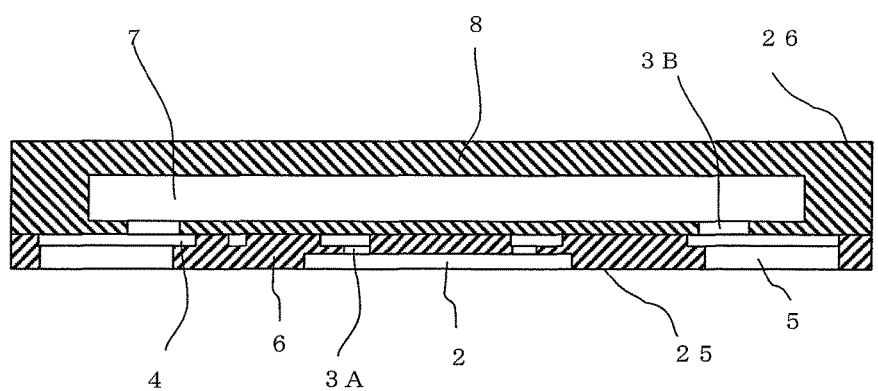

FIGS. 1A and 1B are an illustration of the resin-encapsulated semiconductor device according to the first embodiment of the present invention, in which FIG. 1A is a perspective view of the semiconductor device seen from a rear surface of an external terminal, and FIG. 1B is a sectional view taken along the line A-A of part (1).

As illustrated in FIG. 1A, the resin-encapsulated semiconductor device according to the first embodiment is a 6-pin type multichip package having six external terminals 5. The semiconductor device has the following structure.

The semiconductor device includes a first resin encapsulated body 25 and a second resin encapsulated body 26. The first resin encapsulated body 25 includes a first semiconductor element 2, a plurality of inner wiring lines 4 that are flip-chip connected to bump electrodes 3A formed on a plurality of electrode pads (not shown) formed on the first semiconductor element 2, and the external terminals 5 formed so as to be integrally coupled to one main surface (rear surface) of the plurality of inner wiring lines 4. The first resin encapsulated body 25 is encapsulated in a first resin 6 so that only another main surface (front surface) of the inner wiring lines 4 and a surface to be mounted corresponding to a rear surface of the external terminals 5 are exposed. The second resin encapsulated body 26 includes a second semiconductor element 7 indicated by the broken line in FIG. 1A, and metal bodies serving as bump electrodes 3B that are formed on a plurality of electrode pads (not shown) formed on the second semiconductor element 7 and that are flip-chip connected to the another main surface (front surface) of the inner wiring lines 4. The second semiconductor element 7 and the bump electrodes 3B of the second resin encapsulated body 26 are encapsulated in a second resin 8. A surface of the second resin encapsulated body 26 on which the metal bodies serving as the bump electrodes 3B are exposed and a surface of the first resin encapsulated body 25 on which the inner wiring lines 4 are exposed are integrally formed so as to be in intimate contact with each other.

The first resin encapsulated body 25 has a structure in which the first semiconductor element 2 having the bump electrodes 3A formed thereon, the external terminals 5 spaced around the first semiconductor element 2, and the inner wiring lines 4 connected to the bump electrodes 3A and to the external terminals 5 are encapsulated in the first resin 6. A rear surface of the first semiconductor element 2 and the rear surface of the external terminals 5 are exposed from the first resin 6. The rear surface of the first semiconductor element 2, the rear surface of the external terminals 5, and a surface of the first resin 6 are flush with one another, and make a first surface of the semiconductor device.

Further, the second resin encapsulated body 26 has a structure in which the second semiconductor element 7 having the bump electrodes 3B formed thereon is covered with the second resin 8 and a surface of the bump electrodes 3B is exposed from the second resin 8. The inner wiring lines 4 exposed from the first resin encapsulated body 25 and the bump electrodes 3B exposed from the second resin encapsulated body 26 are connected to each other, thereby forming the resin-encapsulated semiconductor device according to the present invention. Note that, the first resin encapsulated body 25 and the second resin encapsulated body 26 are rectangular in a cross section, and the resin-encapsulated semiconductor device including the first resin encapsulated body 25 and the second resin encapsulated body 26 is rectangular in a cross section as well.

As illustrated in FIGS. 1A and 1B, in the resin-encapsulated semiconductor device according to the first embodiment, the first semiconductor element 2 and the second semiconductor element 7 are flip-chip connected to the inner wiring lines 4 via the bump electrodes 3A and 3B, respectively, and are mounted in the semiconductor device so as to be opposed to each other. Such opposed mounting reduces a length of wiring lines between the semiconductor elements compared with the related-art one, which enables efficient design with reduced routing loss (in terms of space, electrical resistance, and the like).

According to the first embodiment, the first semiconductor element 2 and the second semiconductor element 7 are formed of a control element configured to control MOSFET switching and a MOSFET, respectively. The bump electrodes 3A and 3B formed of a copper material are formed at electrode portions of the first semiconductor element 2 and the second semiconductor element 7, respectively. A film formed by laminating a nickel layer, a palladium layer, and a gold layer in the stated order is formed on the surfaces of the inner wiring lines 4 connected to the bump electrodes 3A and 3B, respectively. A base material of the inner wiring lines 4 is copper. As the first resin 6 and the second resin 8, a thermosetting epoxy resin containing an ordinary light-shielding component used for encapsulating a semiconductor element is used. Depending on the product specifications and the mode, a light-transmitting encapsulating resin is used as the first resin 6 or the second resin 8.

Further, the surface of the first semiconductor element 2 opposite to a face side is a main surface that is a mounting surface corresponding to the rear surface of the external terminals 5, and is formed so as to be exposed to the outside from the first resin 6. The exposing process is realized by grinding the resin. For example, when the flip-chip connection is made, the first semiconductor element 2 can be set to have a thickness of 250 μm so that the flip-chip connection can be made under a state in which the element has a high rigidity, and, in a resin grinding process thereafter, the first semiconductor element 2 can be thinned to an extent that the first semiconductor element 2 is flush with the external terminals 5.

In particular, as the size of the semiconductor element becomes larger, if the semiconductor element is thinned to, for example, 50 μm, the rigidity of the semiconductor element is lowered, which makes it difficult to make a flip-chip connection to lower the quality or to lower the manufacturing yield. In the resin-encapsulated semiconductor device according to the first embodiment, even when a plurality of larger semiconductor elements are mounted thereon, the flip-chip connection is made in the processes described above, and thus, a thinner semiconductor device can be provided with a stable yield.

A resin-encapsulated semiconductor device according to a second embodiment of the present invention is described below.

Figure 2:
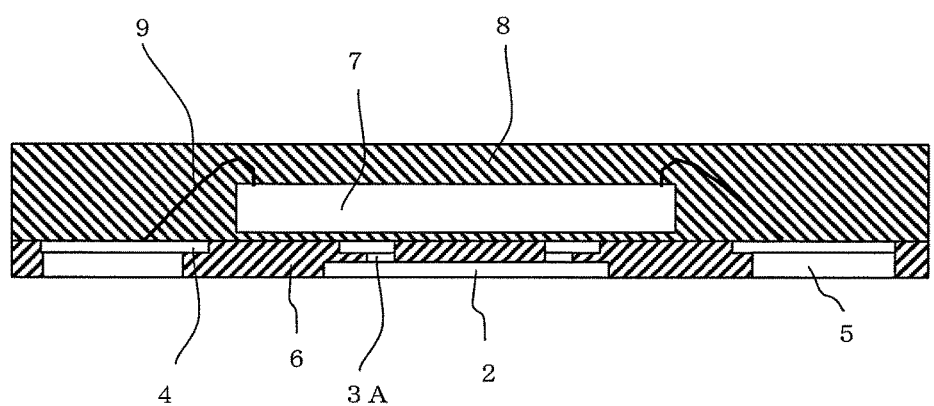
FIG. 2 is a sectional view for illustrating a structure of a resin-encapsulated semiconductor device according to a second embodiment of the present invention.

FIG. 2 is a sectional view for illustrating the resin-encapsulated semiconductor device according to the second embodiment of the present invention. The second embodiment has a structure equivalent to that of the first embodiment except for the following points. The second semiconductor element 7 is fixed to a main surface of the first resin 6 in a face up manner using an adhesive, and the plurality of electrode pads formed on the second semiconductor element 7 and the plurality of inner wiring lines 4 are connected to each other by wire bonding using metal wires 9 corresponding to metal bodies according to this embodiment. As the metal wires 9 used in the second embodiment, copper wires are used. Further, instead of the structure of the semiconductor element exemplified in the first embodiment, the first semiconductor element 2 and the second semiconductor element 7 may be a MOSFET and a control element configured to control MOSFET switching, respectively.

In this case, composition of the first resin 6 and composition of the second resin 8 may be separately determined. The compositions may be the same, or may be different from each other. For example, when the second semiconductor element 7 is an optical element and the first semiconductor element 2 is a control element thereof, it is possible that the second resin 8 is a transparent resin and the first resin 6 is a light-shielding resin.

A resin-encapsulated semiconductor device according to a third embodiment of the present invention is described below.

Figure 3A:
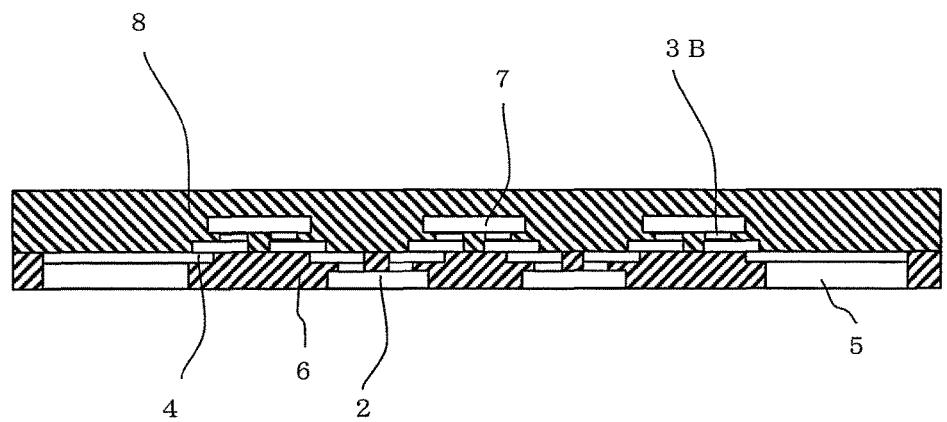
FIG. 3A and FIG. 3B are sectional views for illustrating a structure of a resin-encapsulated semiconductor device according to a third embodiment of the present invention, in which flip-chip connection is used in FIG. 3A, and in which wire bonding connection is used with flip-chip connection in FIG. 3B.
Figure 3B:
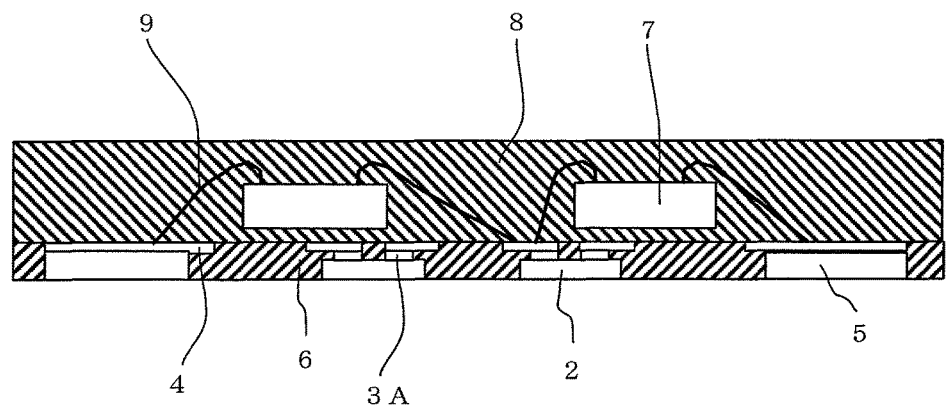

FIGS. 3A to 3B are sectional views for illustrating the resin-encapsulated semiconductor device according to the third embodiment of the present invention. The third embodiment has a structure equivalent to that of the first embodiment, but is different therefrom in that each of the first semiconductor element 2 and the second semiconductor element 7 is replaced by a plurality of semiconductor elements.

As illustrated in FIG. 3A, a plurality of first semiconductor elements 2 and a plurality of second semiconductor elements 7 are flip-chip connected to a plurality of inner wiring lines 4. Alternatively, as illustrated in FIG. 3B, a plurality of first semiconductor elements 2 and the plurality of inner wiring lines 4 may be flip-chip connected to each other, and a plurality of second semiconductor elements 7 and the plurality of inner wiring lines 4 may be connected to each other by wire bonding. Modes of connecting the plurality of first semiconductor elements 2 and the plurality of second semiconductor elements 7 to the plurality of inner wiring lines 4 employ combinations selected from wire bonding connection and flip-chip connection depending on an object to be attained by a target product.

As described above, the resin-encapsulated semiconductor device according to the third embodiment provides packaging options that makes full use of limited space without increasing the size of the semiconductor device even for more sophisticated product specifications or application to be attained by a plurality of semiconductor elements or a plurality of components, and can contribute to development of electronic equipment that is desired to have a smaller size, a smaller thickness, and higher integration.

A resin-encapsulated semiconductor device according to a fourth embodiment of the present invention is described below.

Figure 4A:
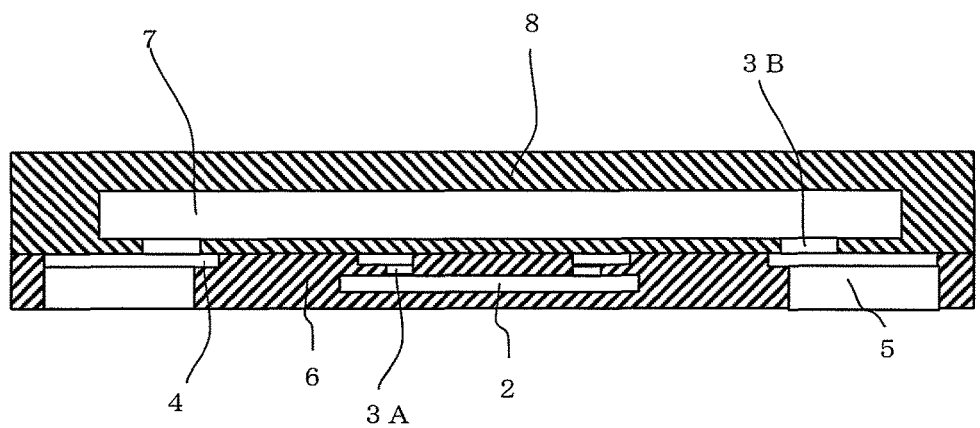
FIG. 4A and FIG. 4B are sectional views for illustrating a structure of a resin-encapsulated semiconductor device according to a fourth embodiment of the present invention.
Figure 4B:
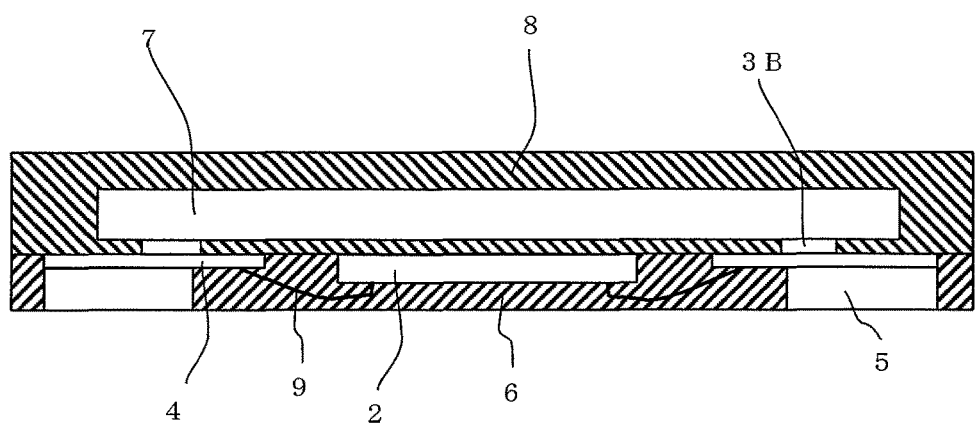

FIGS. 4A and 4B are sectional views for illustrating the resin-encapsulated semiconductor device according to the fourth embodiment of the present invention. The fourth embodiment has a structure equivalent to that of the first embodiment. However, the surface of the first semiconductor element 2 opposite to the face side is not flush with the mounting surface corresponding to the rear surface of the external terminals 5, and is formed so as not to be exposed to the outside from the first resin 6. FIG. 4A is an illustration of a case in which the first semiconductor element 2 is flip-chip connected and a face thereof is opposed to the second semiconductor element 7. FIG. 4B is an illustration of a case in which the first semiconductor element 2 is connected by wire bonding and the face thereof is in the same direction as that of a face of the second semiconductor element 7. When the product specifications do not allow exposure of the first semiconductor element 2 to the outside, it is effective to use structures in which the first semiconductor element 2 is embedded in the first resin 6 as illustrated in FIGS. 4A and 4B.

Next, a method of manufacturing the resin-encapsulated semiconductor device according to the first embodiment of the present invention is described with reference to sectional views for illustrating process steps thereof.

Figure 5A:
FIG. 5A to FIG. 5E are sectional views for illustrating process steps of a method of manufacturing the resin-encapsulated semiconductor device according to the first embodiment of the present invention.
Figure 5B:
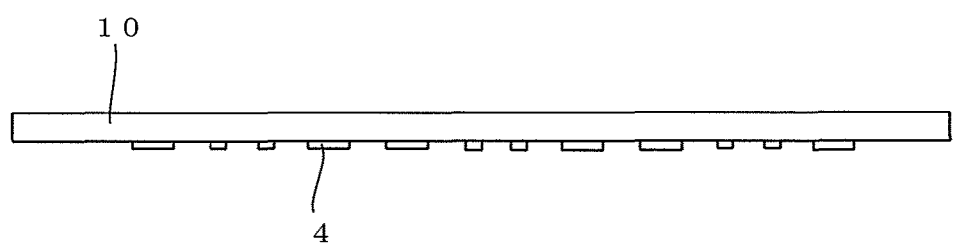
Figure 5C:
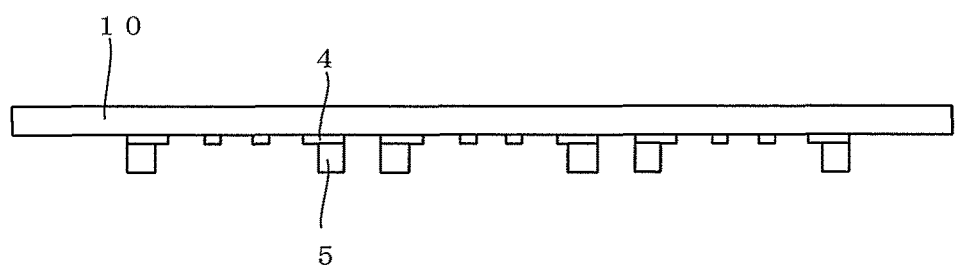

As illustrated in FIG. 5A, first, a substrate 10 is prepared. The substrate 10 is an iron-based steel plate having a length of 250 mm, a width of 80 mm, and a thickness of 250 μm. Other than this, a copper-based alloy material or a nickel-based alloy material may be used as well. Further, a plate of ceramic or fiber reinforced plastic (FRP) that is an insulator, or a plate of an organic material such as a polyimide may be used as well. As illustrated in FIG. 5B, a wiring pattern having a thickness of 15 μm is formed on one main surface of the substrate 10 by electrolytic plating or printing using the inner wiring lines 4 of copper. After that, as illustrated in FIG. 5C, a pattern of the external terminals 5 having a thickness of 80 μm is formed by electrolytic plating on a part of the surface of the inner wiring lines 4 on which the external terminals 5 are to be formed on a side opposite to the substrate 10. The external terminals are formed of a single layer material of solder, gold, silver, copper, aluminum, palladium, or nickel, or a multilayer metal material including laminated layers thereof.

Figure 5D:
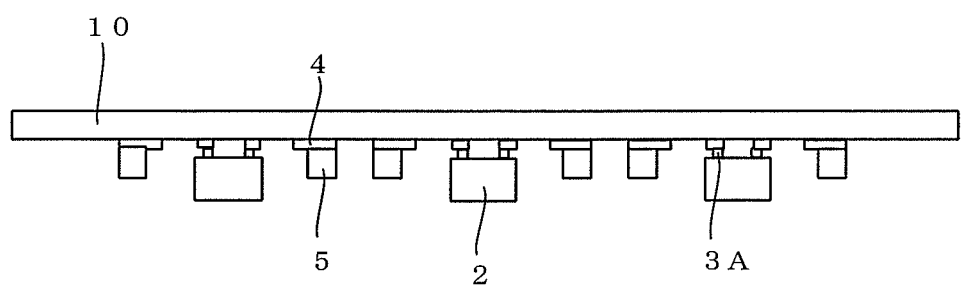

Then, as illustrated in FIG. 5D, the first semiconductor element 2 that is back ground to have a thickness of 250 μm is flip-chip connected to the surface of a part of the inner wiring lines 4 via the bump electrodes 3A.

Figure 5E:
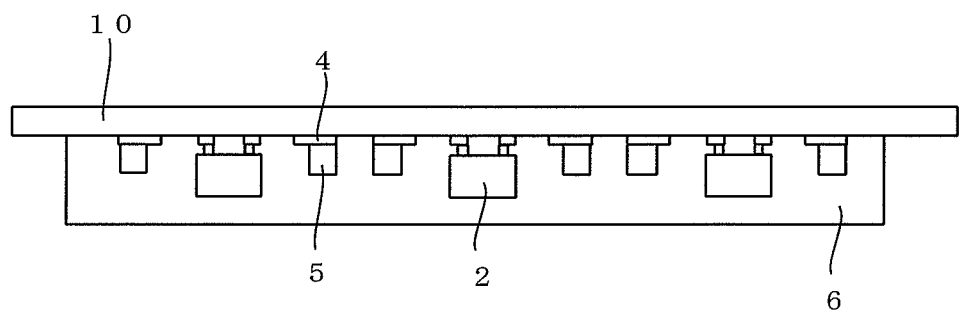

Then, as illustrated in FIG. 5E, the inner wiring lines 4, the external terminals 5, and the first semiconductor element 2 on the one main surface side of the substrate 10 are encapsulated in the first resin 6 by transfer molding to form a resin encapsulated body having a resin thickness of about 200 μm. As the first resin 6, a thermosetting epoxy resin containing an ordinary light-shielding component used for encapsulating a semiconductor element is used.

Figure 6A:
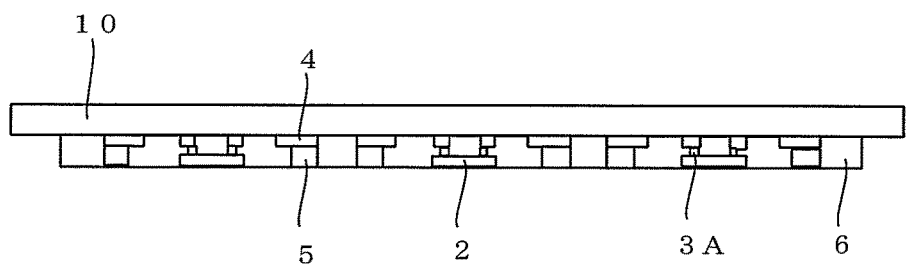
FIG. 6A to FIG. 6E are sectional views continued from FIG. 5E for illustrating process steps of the method of manufacturing the resin-encapsulated semiconductor device according to the first embodiment of the present invention.
Figure 6B:
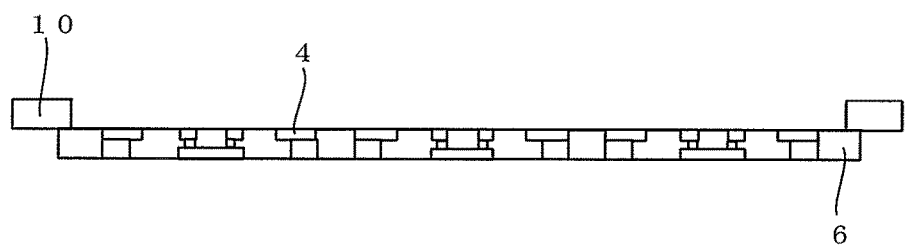
Figure 6C:
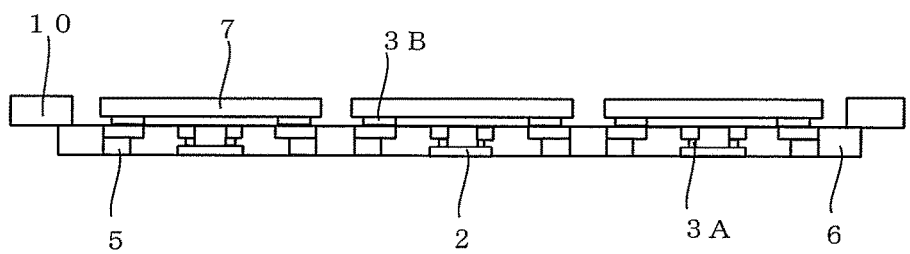

Then, as illustrated in FIG. 6A, one entire main surface of the first resin 6 is ground to expose the mounting surface of the external terminals 5 and the surface of the first semiconductor element 2 on the side opposite to the face side. Then, as illustrated in FIG. 6B, another main surface of the substrate 10 except for edge portions thereof is opened by etching to expose the inner wiring lines 4 and the first resin 6. Then, as illustrated in FIG. 6C, the second semiconductor element 7 and the inner wiring lines 4 are flip-chip connected to each other via the bump electrodes 3B arranged on the second semiconductor element 7.

Figure 6D:
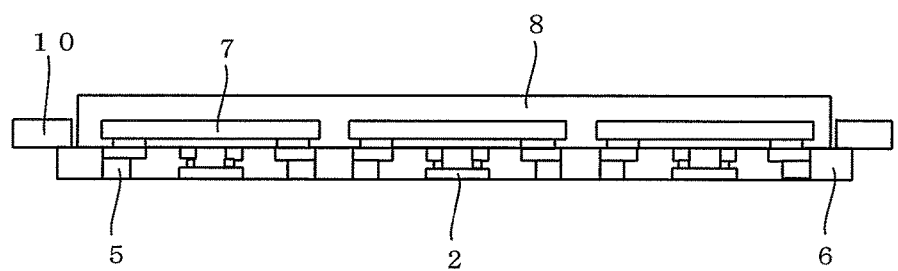

Then, as illustrated in FIG. 6D, the second semiconductor element 7 and the inner wiring lines 4 are encapsulated in the second resin 8 by transfer molding. In this manner, the first resin 6 and the second resin 8 are integrally formed so as to be in intimate contact with each other to form the resin encapsulated body. As the second resin 8, similarly to the first resin 6, a thermosetting epoxy resin containing an ordinary light-shielding component is used. Further, when the surfaces of the inner wiring lines 4 exposed by etching and the surface of the first resin 6 are cleaned by plasma processing or the like before the integral formation with the second resin 8 is performed, adherence of the resins at the interface is enhanced, thereby being capable of obtaining a highly reliable resin encapsulated body. In forming the second resin 8, potting or pressing may be used instead of transfer molding.

Figure 6E:
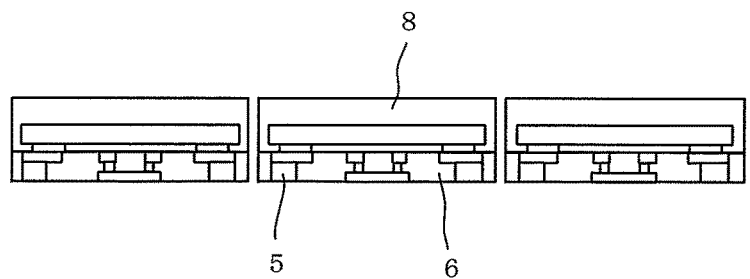
Figure 7A:
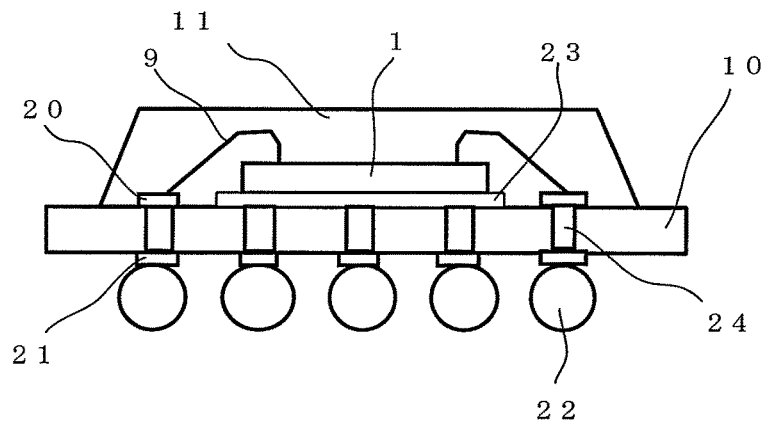
Figure 7B:
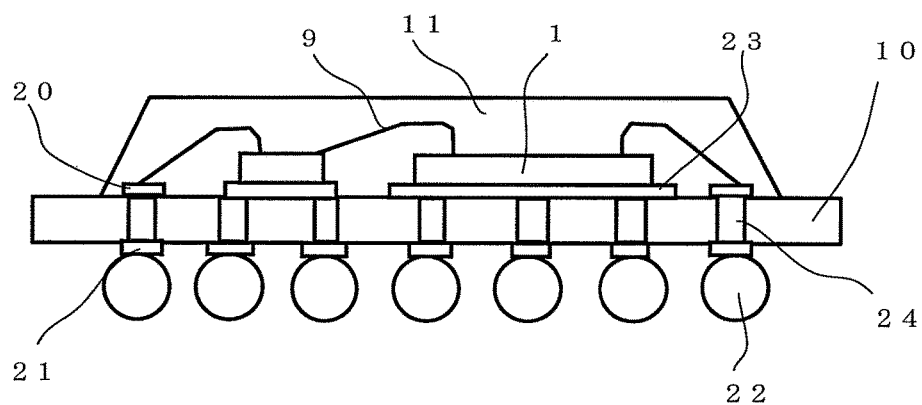
Figure 7C:
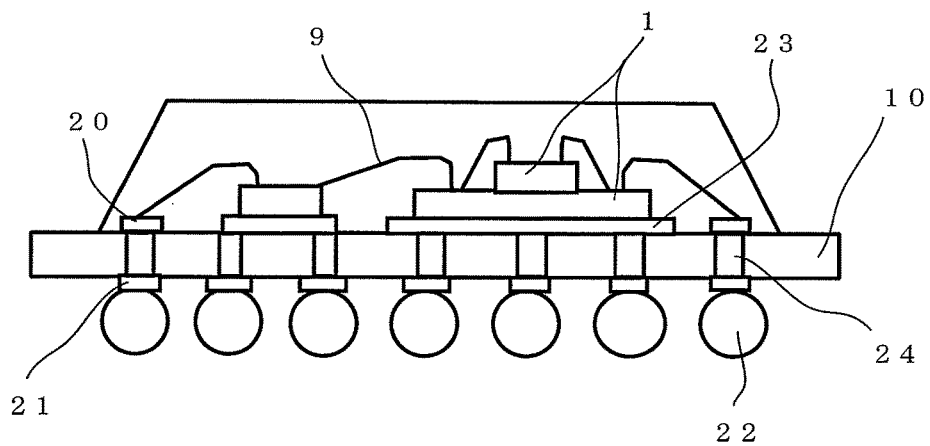

Finally, as illustrated in FIG. 6E, the resin encapsulated body is separated by blade dicing to complete individual resin-encapsulated semiconductor devices. Breaking or laser cutting may be used instead of blade dicing.

Next, a resin-encapsulated semiconductor device according to a fifth embodiment of the present invention is described below.

Figure 8A:
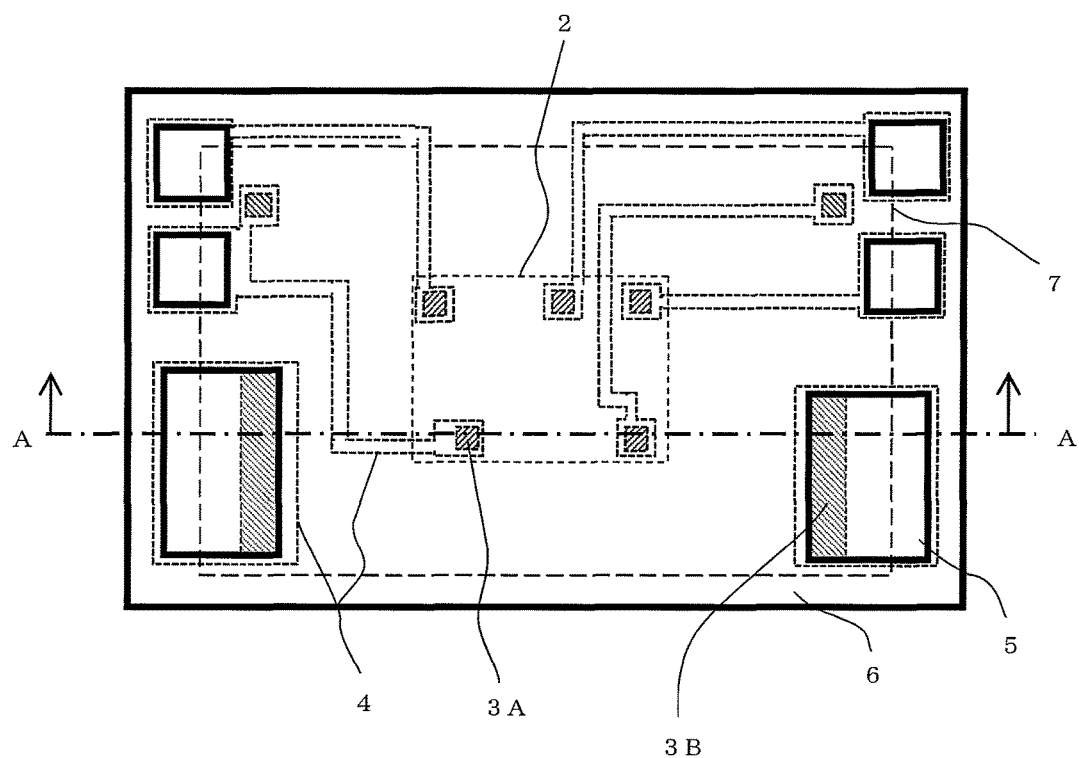
Figure 8B:
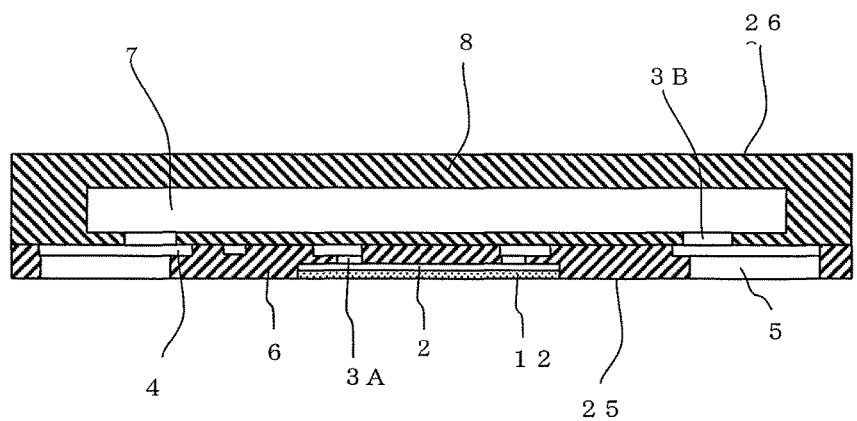

FIGS. 8A and 8B are an illustration of the resin-encapsulated semiconductor device according to the fifth embodiment of the present invention, in which FIG. 8A is a perspective view of the semiconductor device seen from a rear surface of an external terminal, and FIG. 8B is a sectional view taken along the line A-A of part (1).

As illustrated in FIG. 8A, the resin-encapsulated semiconductor device according to the fifth embodiment is a 6-pin type multichip package having six external terminals 5. The semiconductor device includes a first resin encapsulated body 25 and a second resin encapsulated body 26. The first resin encapsulated body 25 includes a first semiconductor element 2, plurality of inner wiring lines 4 that are flip-chip connected to bump electrodes 3A formed on a plurality of electrode pads (not shown) formed on the first semiconductor element 2, and the external terminals 5 formed so as to be integrally coupled to one main surface (rear surface) of the plurality of inner wiring lines 4. The first resin encapsulated body 25 is encapsulated in a first resin 6 so that only another main surface (front surface) of the inner wiring lines 4 and a surface to be mounted corresponding to a rear surface of the external terminals 5 are exposed. The second resin encapsulated body 26 includes a second semiconductor element 7, and metal bodies serving as bump electrodes 3B that are formed on a plurality of electrode pads (not shown) formed on the second semiconductor element 7 and that are flip-chip connected to the another main surface (front surface) of the inner wiring lines 4. The second semiconductor element 7 and the bump electrodes 3B of the second resin encapsulated body 26 are encapsulated in a second resin 8. A surface of the second resin encapsulated body 26 on which the metal bodies serving as the bump electrodes 3B are exposed and a surface of the first resin encapsulated body 25 on which the inner wiring lines 4 are exposed are integrally formed so as to be in intimate contact with each other.

The first resin encapsulated body 25 has a structure in which the first semiconductor element 2 having the bump electrodes 3A formed thereon, a covering layer 12 formed on a surface of the first semiconductor element 2 opposite to a face side thereof, the external terminals 5 spaced around the first semiconductor element 2, and the inner wiring lines 4 connected to the bump electrodes 3A and to the external terminals 5 are encapsulated in the first resin 6. The covering layer 12 formed on the surface of the first semiconductor element 2 opposite to the face side and the rear surface of the external terminals 5 are exposed from the first resin 6. The covering layer 12 formed on the surface of the first semiconductor element 2 opposite to the face side, the rear surface of the external terminals 5, and a surface of the first resin 6 are flush with one another, and make a first surface of the semiconductor device.

Further, the second resin encapsulated body 26 has a structure in which the second semiconductor element 7 having the bump electrodes 3B formed thereon is covered with the second resin 8 and a surface of the bump electrodes 3B is exposed from the second resin 8. The inner wiring lines 4 exposed from the first resin encapsulated body 25 and the bump electrodes 3B exposed from the second resin encapsulated body 26 are connected to each other, thereby forming the resin-encapsulated semiconductor device according to the present invention. Note that, the first resin encapsulated body 25 and the second resin encapsulated body 26 are rectangular in a cross section, and the resin-encapsulated semiconductor device including the first resin encapsulated body 25 and the second resin encapsulated body 26 is rectangular in a cross section as well.

As illustrated in FIGS. 8A and 8B, in the resin-encapsulated semiconductor device according to the fifth embodiment, the first semiconductor element 2 and the second semiconductor element 7 are flip-chip connected to the inner wiring lines 4 via the bump electrodes 3A and 3B, respectively, and are mounted in the semiconductor device so as to be opposed to each other. Such opposed mounting reduces a length of wiring lines between the semiconductor elements compared with the related-art one, which enables efficient design with reduced routing loss (in terms of space, electrical resistance, and the like). Further, the covering layer 12 formed on the surface of the first semiconductor element 2 opposite to the face side protects the first semiconductor element 2 from an external environment.

Also according to the fifth embodiment, the first semiconductor element 2 and the second semiconductor element 7 are formed of a control element configured to control MOSFET switching and a MOSFET, respectively. The bump electrodes 3A and 3B formed of a copper material are formed at electrode portions of the first semiconductor element 2 and the second semiconductor element 7, respectively. A film formed by laminating a nickel layer, a palladium layer, and a gold layer in the stated order is formed on the surfaces of the inner wiring lines 4 connected to the bump electrodes 3A and 3B, respectively. A base material of the inner wiring lines 4 is copper. As the first resin 6 and the second resin 8, a thermosetting epoxy resin containing an ordinary light-shielding component used for encapsulating a semiconductor element is used. Depending on the product specifications and the mode, a light-transmitting encapsulating resin is used as the first resin 6 or the second resin 8.

When the first semiconductor element 2 is sensitively affected by external light, by adopting a light-shielding material as the covering layer 12 formed on the surface of the first semiconductor element 2 opposite to the face side, the effect of external light can be reduced.

Further, a surface of the covering layer 12 formed on the surface of the first semiconductor element 2 opposite to the face side is a main surface flush with the mounting surface corresponding to the rear surface of the external terminals 5, and is exposed to the outside from the first resin 6. The exposing process is realized by grinding the resin. For example, in the case of the flip-chip connection, by setting the first semiconductor element 2 to have a thickness of 50 µm and coating the covering layer 12 formed on the surface of the first semiconductor element 2 opposite to the face side with a resin having a thickness of 80 µm, the flip-chip connection is made under a state in which the element has a high rigidity, and, in the resin grinding process thereafter, by grinding the covering layer 12 of the resin formed on the surface of the first semiconductor element 2 opposite to the face side so as to be flush with the external terminals 5, the covering layer 12 can be thinned.

In particular, in the resin grinding process, it is difficult to grind three kinds of different materials of the external terminals 5 (for example, cupper), the first semiconductor element 2 (for example, silicon), and the first resin 6 (epoxy resin), and there is a possibility that the quality may be lowered or the manufacturing yield may be lowered. By this reason, in the resin-encapsulated semiconductor device according to the fifth embodiment, the covering layer 12 of the resin is formed on the surface of the first semiconductor element 2 opposite to the face side so that only two kinds of materials (for example, copper and an epoxy resin) of the external terminals 5 (for example, copper), the first resin 6 (for example, an epoxy resin), and the covering layer 12 (for example, the epoxy resin) are ground in the grinding process. When a plurality of larger semiconductor elements are mounted, the grinding process described above can be performed with more simplicity, and a multichip semiconductor device having higher integration and a smaller thickness can thus be provided with a stable yield. In particular, silicon that is a base material of the first semiconductor element 2 is a material that is difficult to cut, and thus, the formation of the covering layer 12 to enhance the free-cutting property is effective in improving the quality and in enhancing the manufacturing yield.

A resin-encapsulated semiconductor device according to a sixth embodiment of the present invention is described below.

Figure 9:
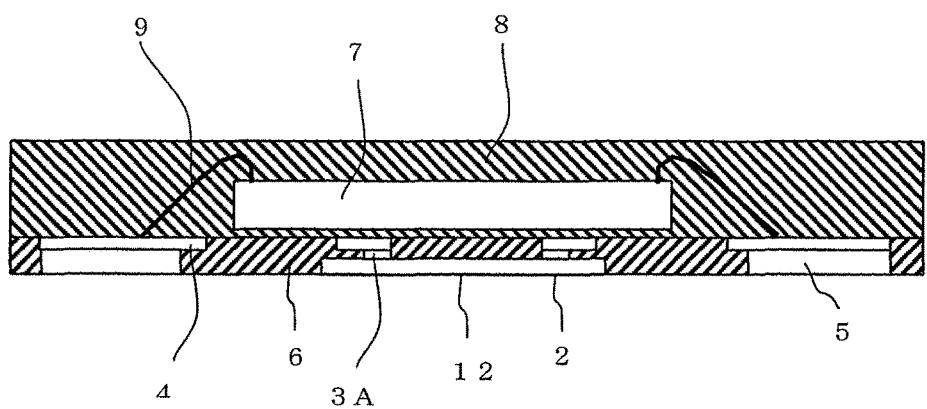
FIG. 9 is a sectional view for illustrating a structure of a resin-encapsulated semiconductor device according to a sixth embodiment of the present invention.

FIG. 9 is a sectional view for illustrating the resin-encapsulated semiconductor device according to the sixth embodiment of the present invention. The sixth embodiment has a structure equivalent to that of the fifth embodiment except for the following points. The second semiconductor element 7 is fixed to a main surface of the first resin 6 in a face up manner using an adhesive, and the plurality of electrode pads formed on the second semiconductor element 7 and the plurality of inner wiring lines 4 are connected to each other by wire bonding using metal wires 9 corresponding to metal bodies according to this embodiment. As the metal wires 9 used in the sixth embodiment, copper wires are used. Further, instead of the structure of the semiconductor element exemplified in the fifth embodiment, the first semiconductor element 2 and the second semiconductor element 7 may be a MOSFET and a control element configured to control MOSFET switching, respectively.

In this case, composition of the first resin 6 and composition of the second resin 8 may be separately determined. The compositions may be the same, or may be different from each other. For example, when the second semiconductor element 7 is an optical element and the first semiconductor element 2 is a control element thereof, it is possible that the second resin 8 is a transparent resin and the first resin 6 is a light-shielding resin.

A resin-encapsulated semiconductor device according to a seventh embodiment of the present invention is described below.

Figure 10A:
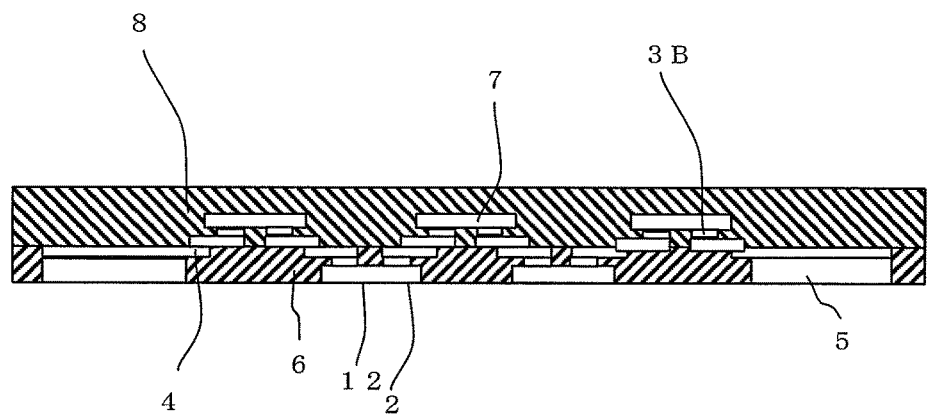
FIG. 10A and FIG. 10B are sectional views for illustrating a structure of a resin-encapsulated semiconductor device according to a seventh embodiment of the present invention.
Figure 10B:
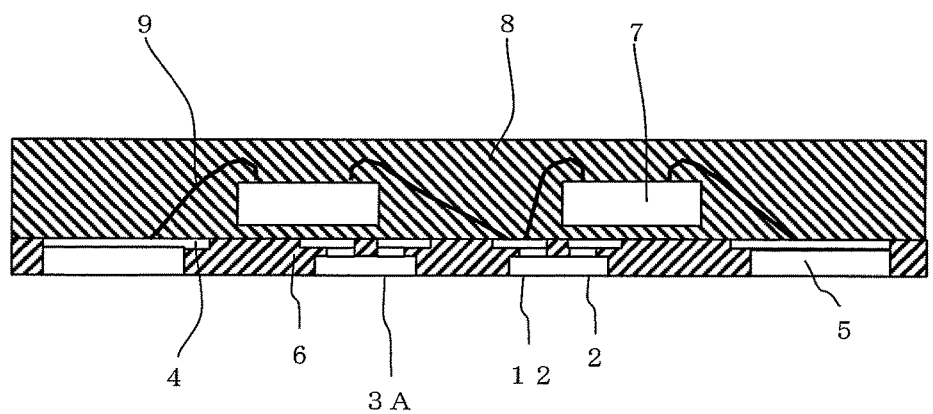

FIGS. 10A and 10B are sectional views for illustrating the resin-encapsulated semiconductor device according to the seventh embodiment of the present invention. The seventh embodiment has a structure equivalent to that of the fifth embodiment, but is different therefrom in that each of the first semiconductor element 2 and the second semiconductor element 7 is replaced by a plurality of semiconductor elements.

As illustrated in FIG. 10A, a plurality of first semiconductor elements 2 and a plurality of second semiconductor elements 7 are flip-chip connected to a plurality of inner wiring lines 4. Alternatively, as illustrated in FIG. 10B, a plurality of first semiconductor elements 2 and the plurality of inner wiring lines 4 may be flip-chip connected to each other, and a plurality of second semiconductor elements 7 and the plurality of inner wiring lines 4 may be connected to each other by wire bonding. Modes of connecting the plurality of first semiconductor elements 2 and the plurality of second semiconductor elements 7 to the plurality of inner wiring lines 4 employ combinations selected from wire bonding connection and flip-chip connection depending on an object to be attained by a target product.

As described above, the resin-encapsulated semiconductor device according to the seventh embodiment provides packaging options that makes full use of limited space without increasing the size of the semiconductor device even for more sophisticated product specifications or application to be attained by a plurality of semiconductor elements or a plurality of components, and can contribute to development of electronic equipment that is desired to have a smaller size, a smaller thickness, higher integration, and higher quality.

Next, a method of manufacturing the resin-encapsulated semiconductor device according to the fifth embodiment of the present invention is described with reference to sectional views for illustrating process steps thereof.

Figure 11A:
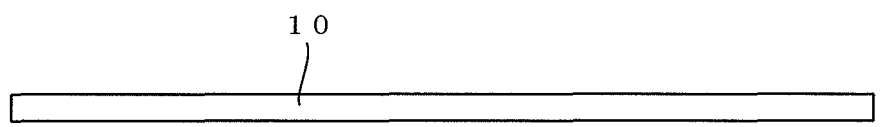
FIG. 11A to FIG. 11E are sectional views for illustrating process steps of a method of manufacturing the resin-encapsulated semiconductor device according to the fifth embodiment of the present invention.
Figure 11B:
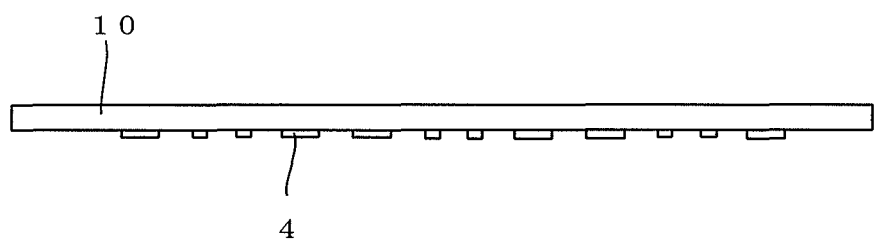
Figure 11C:
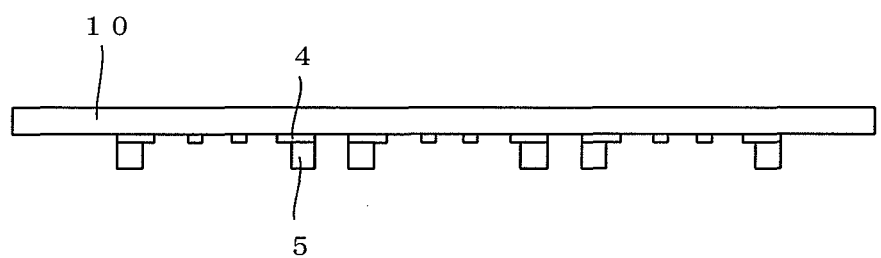

As illustrated in FIG. 11A, first, a substrate 10 is prepared. The substrate 10 is an iron-based steel plate having a length of 250 mm, a width of 80 mm, and a thickness of 250 µm. Other than this, a copper-based alloy material or a nickel-based alloy material may be used as well. Further, a plate of ceramic or fiber reinforced plastic (FRP) that is an insulator, or a plate of an organic material such as a polyimide may be used as well. As illustrated in FIG. 11B, a wiring pattern having a thickness of 15 µm is formed on one main surface of the substrate 10 by electrolytic plating or printing using the inner wiring lines 4 of copper. After that, as illustrated in FIG. 11C, a pattern of the external terminals 5 having a thickness of 80 µm is formed by electrolytic plating on a part of the surface of the inner wiring lines 4 on which the external terminals 5 are to be formed on a side opposite to the substrate 10. The external terminals are formed of a single layer material of solder, gold, silver, copper, aluminum, palladium, or nickel, or a multilayer metal material including laminated layers thereof.

Figure 11D:
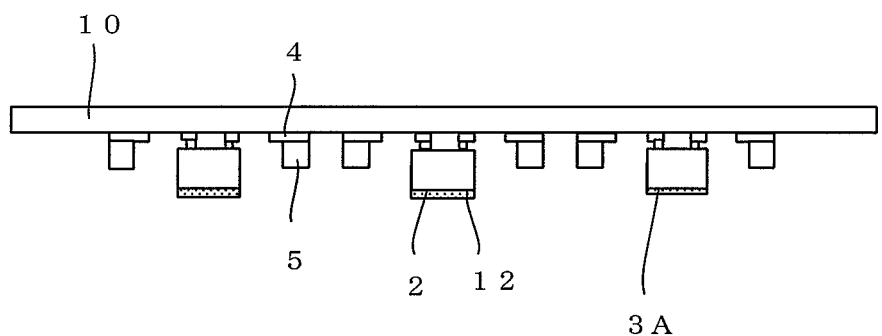
Figure 11E:
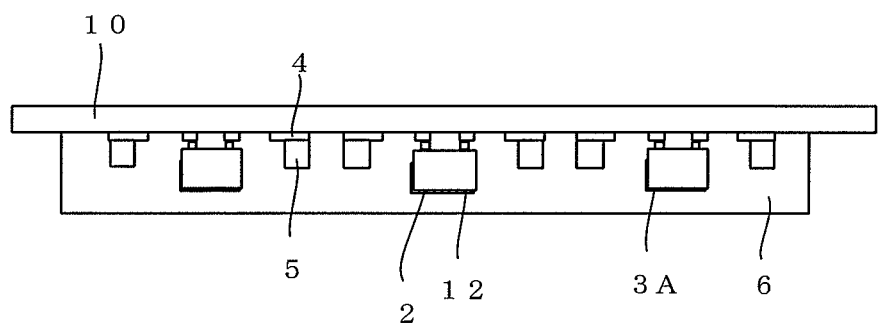

Then, as illustrated in FIG. 11D, the first semiconductor element 2 obtained by separating a wafer that has been back ground to have a thickness of 50 µm, and has the covering layer 12 of the resin at a thickness of 80 µm coating the back-ground surface thereof is flip-chip connected to the surface of a part of the inner wiring lines 4 via the bump electrodes 3A. Then, as illustrated in FIG. 11E, the inner wiring lines 4, the external terminals 5, and the first semiconductor element 2 on the one main surface side of the substrate 10 are encapsulated in the first resin 6 by transfer molding to form a resin encapsulated body having a resin thickness of about 200 µm. As the first resin 6, a thermosetting epoxy resin containing an ordinary light-shielding component used for encapsulating a semiconductor element is used.

Figure 12A:
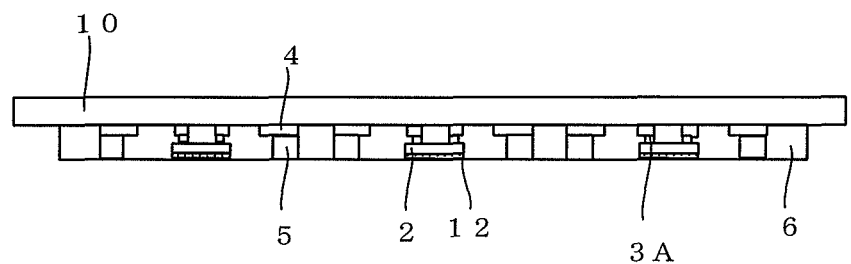
FIG. 12A to FIG. 12E are sectional views continued from FIG. 11E for illustrating process steps of the method of manufacturing the resin-encapsulated semiconductor device according to the fifth embodiment of the present invention.
Figure 12B:
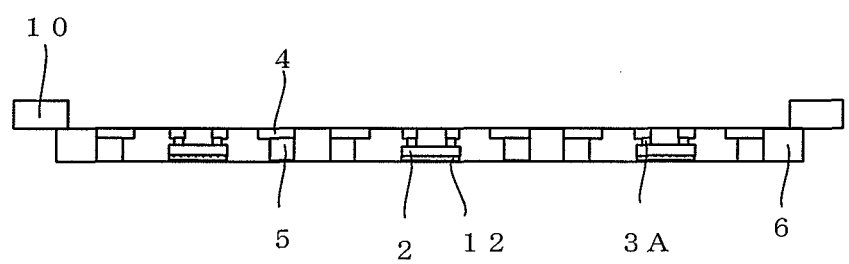
Figure 12C:
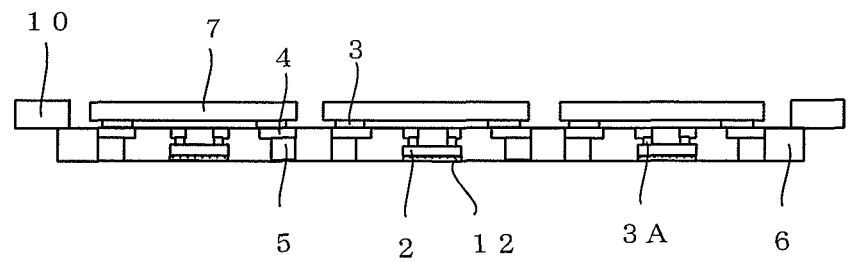

Then, as illustrated in FIG. 12A, one entire main surface of the first resin 6 is ground to expose the mounting surface of the external terminals 5 and the covering layer 12 formed on the surface of the first semiconductor element 2 on the side opposite to the face side. Then, as illustrated in FIG. 12B, another main surface of the substrate 10 except for edge portions thereof is opened by etching to expose the inner wiring lines 4 and the first resin 6. Then, as illustrated in FIG. 12C, the second semiconductor element 7 and the inner wiring lines 4 are flip-chip connected to each other via the bump electrodes 3B arranged on the second semiconductor element 7.

Figure 12D:
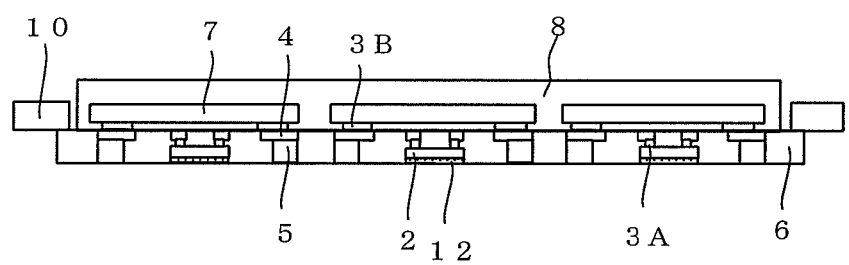

Then, as illustrated in FIG. 12D, the second semiconductor element 7 and the inner wiring lines 4 are encapsulated in the second resin 8 by transfer molding. In this manner, the first resin 6 and the second resin 8 are integrally formed so as to be in intimate contact with each other to form the resin encapsulated body. As the second resin 8, similarly to the first resin 6, a thermosetting epoxy resin containing an ordinary light-shielding component is used. Further, when the surfaces of the inner wiring lines 4 exposed by etching and the surface of the first resin 6 are cleaned by plasma processing or the like before the integral formation with the second resin 8 is performed, adherence of the resins at the interface is enhanced, thereby being capable of obtaining a highly reliable resin encapsulated body. In forming the second resin 8, potting or pressing may be used instead of transfer molding.

Figure 12E:
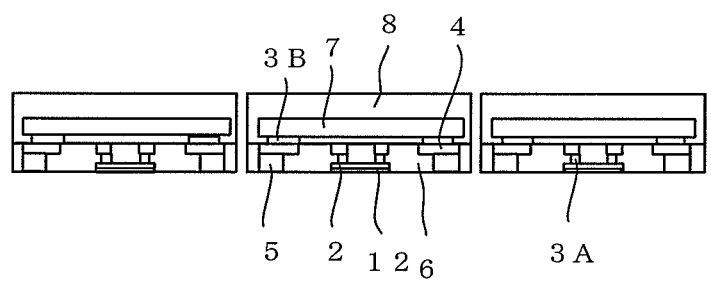

Finally, as illustrated in FIG. 12E, the resin encapsulated body is separated by blade dicing to complete individual resin-encapsulated semiconductor devices. Breaking or laser cutting may be used instead of blade dicing.

What is claimed is:

1. A resin-encapsulated semiconductor device, comprising:
a first resin-encapsulated body; and
a second resin-encapsulated body,
the first resin-encapsulated body comprising:
  a first semiconductor element;
  an external terminal spaced around the first semiconductor element;
  inner wiring connecting the first semiconductor element and a surface of the external terminal to each other;
  a first resin covering the first semiconductor element, the external terminal, and the inner wiring,
wherein a rear surface of the external terminal and a surface of the inner wiring are exposed from the first resin, and a rear surface of the first semiconductor element is covered by the first resin,
the second resin-encapsulated body comprising:
  a second semiconductor element;
  a second resin covering the second semiconductor element; and
  a metal body connected to the second semiconductor element, and partly exposed from the second resin, wherein a surface of the first resin-encapsulated body on which the inner wiring is exposed and a surface of the second resin-encapsulated body on which the metal body is exposed are formed so as to be in intimate contact with each other, and the inner wiring and the metal body are electrically connected to each other.

2. A resin-encapsulated semiconductor device according to claim 1, wherein the metal body comprises a bump electrode and the second semiconductor element is a flip-chip connected to the inner wiring.

3. A resin-encapsulated semiconductor device according to claim 1, wherein the metal body comprises a metal wire and the second semiconductor element is connected to the inner wiring by wire bonding.

4. A resin-encapsulated semiconductor device according to claim 1, wherein the composition of the first resin and the composition of the second resin are different from each other.

5. A resin-encapsulated semiconductor device according to claim 1, wherein the first semiconductor element forming the first resin-encapsulated body comprises a plurality of first semiconductor elements.

6. A resin-encapsulated semiconductor device according to claim 1, wherein the second semiconductor element forming the second resin-encapsulated body comprises a plurality of second semiconductor elements.

7. A resin-encapsulated semiconductor device, comprising:
   a first resin-encapsulated body; and
   a second resin-encapsulated body,
   the first resin-encapsulated body comprising:
      a first semiconductor element whose face is disposed downward;
      inner wiring spaced around the first semiconductor element;
      a bonding wire connecting the first semiconductor element and the inner wiring;
      an external terminal integrally coupled to a rear surface of the inner wiring; and
      a first resin covering the first semiconductor element, the bonding wire, the external terminal, and the inner wiring,
   wherein a rear surface of the external terminal and a surface of the inner wiring are exposed from the first resin, and the face of the first semiconductor element is covered by the first resin,
   the second resin-encapsulated body comprising:
      a second semiconductor element;
      a second resin covering the second semiconductor element; and
      a metal body connected to the second semiconductor element, and partly exposed from the second resin,
   wherein a surface of the first resin-encapsulated body on which the inner wiring is exposed and a surface of the second resin-encapsulated body on which the metal body is exposed are formed so as to be in intimate contact with each other, and the inner wiring and the metal body are electrically connected to each other.

8. A resin-encapsulated semiconductor device according to claim 7, wherein the metal body comprises a bump electrode and the second semiconductor element is a flip-chip connected to the inner wiring by wire bonding.

9. A resin-encapsulated semiconductor device according to claim 7, wherein the metal body comprises a metal wire and the second semiconductor element is connected to the inner wiring by wire bonding.

10. A resin-encapsulated semiconductor device according to claim 7, wherein the composition of the first resin and the composition of the second resin are different from each other.

11. A resin-encapsulated semiconductor device according to claim 7, wherein the first semiconductor element forming the first resin-encapsulated body comprises a plurality of first semiconductor elements.

12. A resin-encapsulated semiconductor device according to claim 7, wherein the second semiconductor element forming the second resin-encapsulated body comprises a plurality of second semiconductor elements.

* * * * *